United States Patent [19]

Mikawa et al.

[11] Patent Number: 4,935,795
[45] Date of Patent: Jun. 19, 1990

[54] AVALANCHE PHOTODIODE WITH UNIFORM AVALANCHE MULTIPLICATION

[75] Inventors: Takashi Mikawa, Tokyo; Takao Kaneda, Kawasaki, both of Japan

[73] Assignee: Fujitsu Limited, Kawasaki, Japan

[21] Appl. No.: 391,649

[22] Filed: Aug. 7, 1989

Related U.S. Application Data

[63] Continuation of Ser. No. 37,000, Apr. 10, 1987, abandoned.

[30] Foreign Application Priority Data

Apr. 15, 1986 [JP] Japan .................... 61-086299

[51] Int. Cl.$^5$ .................................. H01L 27/14
[52] U.S. Cl. .................................. 357/30; 357/19;
  357/13; 357/16; 357/61; 357/90
[58] Field of Search .............. 357/13, 16, 19, 61,
  357/30 A, 30 B, 30 E, 30 P

[56] References Cited

U.S. PATENT DOCUMENTS

| | | | |
|---|---|---|---|
| 3,889,284 | 6/1975 | Schiel | 357/30 A |
| 4,212,019 | 7/1980 | Wataze et al. | 357/30 X |
| 4,258,375 | 3/1981 | Hsieh et al. | 357/30 X |
| 4,403,397 | 9/1983 | Bohka et al. | 357/30 X |
| 4,481,523 | 11/1984 | Osaka et al. | 357/13 X |
| 4,651,187 | 3/1985 | Sugimoto et al. | 357/30 A |
| 4,656,494 | 4/1984 | Kobayashi et al. | 357/13 X |
| 4,684,969 | 8/1987 | Tagachi | 357/13 X |

FOREIGN PATENT DOCUMENTS 57-198667 12/1982 Japan .
60-105281 6/1985 Japan .

OTHER PUBLICATIONS

Anoo et al., "In GaAs/InP Separated Absorption and Multiplication Regions Avalanche Photodiode Using Liquid-and VaBr-Phase Epitaxies", *IEEE Journal of Quantum Electronics*, vol. QE-17, Feb., 1981, No. 2, New York, U.S.A., pp. 250-254.
Patent Abstracts of Japan, vol. 9, No. 258 (E-350) [1981], Oct. 16, 1985; & JP-A-60 105 281 (Fujitsu K.K.) 10-06-85-*Abstract*.
Patent Abstracts of Japan, vol. 7, No. 49 (E-161) [1194], Feb. 25, 1983; & JP-A-57 198 667 (Fujitsu K.K.) 06-12-1982 *Abstract*.
*IEEE Journal of Quantum Electronics*, vol. QE-17, No. 2, Feb. 1981, "Ga1-xAlxSb Avalanche Photodiodes: Resonant Impact Ionization With Very High Ratio of Ionization Coefficients", by O. Hildebrand et al., pp. 284-288.
ECOC 83. 9th European Conference on Optical Communication, Geneva, Oct. 23-26, 1983, pp. 479-482, Elsevier Science Publishers B.V., "1.3mum CdHgTe Avalanche Photodiodes for Fiber Optic Applications", by G. Pichard et al.

*Primary Examiner*—William Mintel
*Attorney, Agent, or Firm*—Staas & Halsey

[57] ABSTRACT

An APD of the invention has its avalanche multiplication layer, made of a material which can cause a resonant impact ionization therein; between its window layer having a big band gap energy and light-absorbing layer having a band gap energy smaller than the window layer. The layout of the invention lowers field intensity in the light absorbing layer, thus, a dark current produced by a tunnel effect in the light absorbing layer is reduced. Because of great amount of ionization ratio in the resonant impact ionization phenomena, both excessive noise factor and the applied operating DC voltage to the APD can be much less than that of the prior art APD without employing the resonant impact ionization, as well as the operation speed can be increased. The reduced operation voltage protects unexpected local avalanche breakdown in the pn junction area, thus uniform and reliable avalanche multiplication is always initiated in the multiplication layer, resulting in reduction of dark current and allowing a voltage margin. For fabricating the APD, there is no difficult problem like the difficulty of doping n+ impurity in the p-type window layer in the prior art APD employing the resonant impact ionization. Excessive noise factor below 3, operation at 12.5 V, and operation at 10 GHZ are achieved.

7 Claims, 3 Drawing Sheets

AVALANCHE PHOTODIODE WITH UNIFORM AVALANCHE MULTIPLICATION

This is a continuation of co-pending application Ser. No. 037,000 filed on Apr. 10, 1987, now abandoned.

BACKGROUND OF THE INVENTION

1. Field of the Invention

This invention relates to a semiconductor avalanche photo-diode (referred to hereinafter as APD). More particularly, it relates to an improvement of the APD in dark current, noise and high frequency characteristics by achieving uniform avalanche multiplication therein.

2. Description of the Related Art

A long-distance and high-capacity optical transmission using a wave length of 1.0 to 1.7 μm, where the optical transmission loss of a silica optical fiber becomes minimum, has been increasing in practical use. As an optical detector for this application, an APD device composed of InP/GaInAs (Indium-Phosphorus/Galium-Indium-Arsenide) has been generally used. Its device structure is schematically shown by a cross-sectional side view in FIG. 1. A DC operating voltage of approximately 100 V is applied between a negative electrode 18 and a positive electrode 19. The numeral 11 denotes an n+-type InP substrate. The numeral 12 denotes a light-absorbing layer made of n-type GaInAs, in which electrons and positive holes are excited by an injected light thereinto. The mark "e" denotes an electron, and the mark "ph" denotes a positive hole both of which are produced by light excitation. The arrow marks indicate directions in which the electrons and positive holes move when an operating voltage is applied. The numeral 14 denotes a window layer, or sometimes called a multiplication region, made of InP, in which the positive holes from the light-absorbing region 12 are accelerated by the externally applied voltage so that an avalanche multiplication takes place therein. The numeral 16' denotes a guardring-burying layer made of n⁻-type InP. The numeral 15 denotes a p+-type region doped in the window layer 14, with which a pn junction 17 is formed. The p+-type region 15 and the window layer 14 are transparent so that the injected light can reach the light-absorbing layer 12. The numeral 16 denotes a p-type guardring formed in a guardring-burying layer 16' for relaxing excessive concentration of electric field lines which may cause avalanche breakdown at unexpected low voltage.

However, on the other hand, in order to reduce a multiplication noise and dark current produced in the device of FIG. 1, an APD device employing a resonant impact ionization, which was reported by O. Hildebrand et al. in IEEE JQE-17, No 2, page 284, 1981, has been proposed by T. Kaneda, one of the present inventors, as disclosed in the provisional publication of the Japanese patent Sho No. 60-105281, structure of which is schematically shown by the cross-sectional side view in FIG. 2, or by P. Pichard et al., "1.3 μm CdHgTe AVALANCHE PHOTODIODES FOR FIBER OPTIC APPLICATION" at page 479 of 9th European Conference on Optical Communication, 1983. In FIG. 2, the numeral 21 denotes a p+-type GaSb (Galium-Antimony) substrate. The numeral 24 denotes a window layer made of p-type $Ga_{0.6}Al_{3.4}Sb$ (Galium-Aluminum whose contents ratio is 0.6:0.4, and Antimony). In the window layer 24, an n+ region 25 is provided to form a pn junction 26 with the window layer 24. The numeral 27 denotes a protection film. The numeral 28 denotes an anti-reflection layer. The anti-reflection layer 28, the n+ region 25 and the window layer 24 are all transparent for an injected light which is introduced into a light-absorbing layer 22 described below. The light-absorbing layer 22 is made of p-type $Ga_{0.9}Al_{0.1}Sb$, were electrons and positive holes are produced by an excitation of the injected light thereinto. The numeral 23 denotes an avalanche multiplication region made of $Ga_{0.935}Al_{0.065}Sb$. This particular material, $Ga_{0.935}Al_{0.065}Sb$, can cause an avalanche multiplication by the resonant impact ionization due to positive holes from the light absorbing layer 22 when an electric field of approximately $4 \times 10^4$ V/cm is applied thereto. This requires approximately 20 V between the electrode 20 acting as a positive terminal and an electrode 29 acting as a negative terminal.

In the APD configuration of FIG. 2, the alvalanche multiplication layer 23 must be located on the opposite side of the light absorbing layer 22 from the pn junction 26. In other words, the layers are arranged in the order of: the pn junction 26, window layer 24, the light absorbing layer 22 and the avalanche multiplication layer 23. Accordingly, when the operating reverse voltage is applied between the electrodes 29 and 30 in order to obtain a necessary electric field intensity, i.e. $40 \times 10^4$ V/cm, in the avalanche multiplication layer 23, distribution of the electric field intensity is as shown by the curve labelled "prior art" in FIG. 5. Consequently, the applied voltage corresponding to the required field intensity must be larger than a certain value, and a greater electric field than that in the avalanche multiplication layer 23 must be applied also to the light absorbing layer 22. Thus, there arises undesirable problems that a dark current due to a tunnel effect remains. It is also difficult to dope n-type impurities into the p-type GaAlSb window layer in a mass production process. Therefore, an easy structure for fabrication of the APD employing resonant impact ionization has been requested.

SUMMARY OF THE INVENTION

It is a general object of the invention, therefore, to provide an APD having decreased dark current.

It is another object of the invention to provide an APD having improved noise characteristics as well as improved high frequency characteristics, but requiring a simple fabrication technique.

According to the present invention, an avalanche multiplication layer composed of a semiconductor material which can cause avalanche multiplication by resonant impact ionization is newly provided between a light-absorbing layer and a window layer, in which a pn junction is formed. Light to be detected is injected into the light-absorbing layer, where electrons and positive holes are produced by the excitation of the injected light. Under an application of electric field, the produced positive holes are accelerated into the avalanche multiplication layer so as to cause an avalanche multiplication. Because of the resonant impact ionization in the avalanche multiplication layer, an ionization rate ratio ($\beta/\alpha$) as high as 20 or more is obtained. Thus, this results in low noise as well as fast APD operation.

Further, in the APD of the present invention, the window layer is made of a material having band gap energy larger than that of the multiplication layer. Because of the large band gap energy of the material composing the pn junction where the electric field intensity is maximum, the dark current due to the tunnel effect is reduced. Furthermore, more, the avalanche breakdown voltage of the pn junction is increased as is the breakdown voltage of the APD. The increased breakdown voltage at the pn junction further contributes to the increase of the breakdown voltage of a portion where the electric field lines are concentrated, such as the peripheral portion of the pn junction, as well as a portion having a lattice defect of the pn junction. This results in a further increase of the breakdown voltage of the APD.

In addition, in the present invention, because of the configuration having the order of the pn junction, window layer, the avalanche multiplication layer, and light absorbing layer, the electric field intensity in the light absorbing layer is lowered. Thus, results in reduction of the dark current caused by the tunnel effect, as in the prior art APD. This configuration also contributes to lowering the applied voltage which induces the necessary field intensity in the multiplication layer, because there is no light-absorbing layer between the multiplication layer and the pn junction.

Still further, owing to resonant impact ionization itself taking place at a low voltage, as well as owing to the configuration including the above-mentioned window layer having the large band gap energy, the applied bias voltage can be reduced. This results in allowing a voltage margin for the operation voltage of the APD.

The above-mentioned features and advantages of the present invention, together with other objects and advantages, which will become apparent, will be more fully described hereinafter.

DESCRIPTION OF THE PREFERRED EMBODIMENTS

Figure 4:
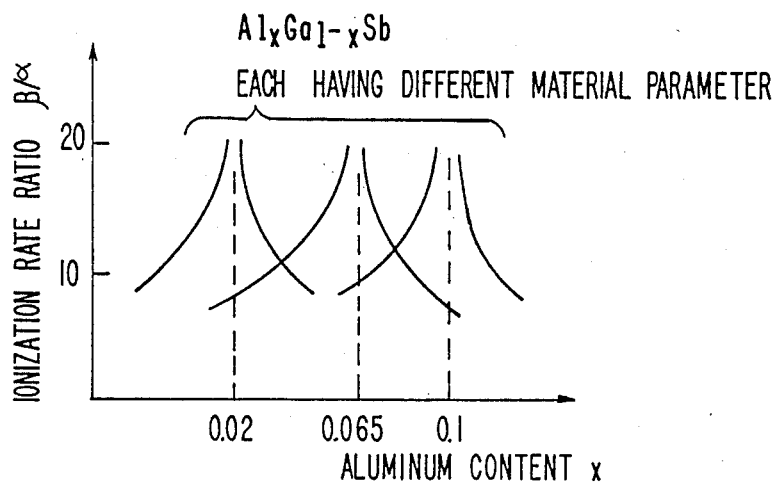
FIG. 4 is a graph of the aluminum content versus the ionization rate ratio in the APD in FIG. 3.

Before described the preferred embodiment of the present invention, resonant impact ionization shall be briefly explained hereinafter. Resonant impact ionization is a phenomena in which the spin orbit splitting $\Delta$ of the valence band becomes equal (thus called resonant) to the band gap energy $E_g$ between the conduction band and the valence band. A large ionization rate ratio $\beta/\alpha$ (where $\beta$ indicates ionization factor of the positive hole therein and $\alpha$ indicates the ionization factor of the electron therein) is obtained even at a lower voltage than that of conventional avalanche break down which does not employ the resonant impact ionization. This phenomena can cause an avalanche breakdown in a particular semiconductor material, such as a compound of Aluminum-Galium-Antimony ($Al_xGa_{1-x}Sb$) where x indicates the content ratio of Al to Ga, for example, $x=0.065$ for example, when an electric field, such as approximately $4 \times 10^4$ V/cm, is applied thereto. Then, the value of the ionization rate ratio $\beta/\alpha$ can be as high as more than 20. As is well known, the greater the value of the ionization ratio the greater the reduction in the fluctuation noise produced in the APD, as well as the faster the operation of the APD. As shown in FIG. 4, the value of the ionization rate ratio $\beta/\alpha$ changes depending on the value x, where x indicates content of aluminum in $Al_xGa_{1-x}Sb$. The location of the peak value changes as shown in the figure depending on parameters of the materials. In the present invention, the value 0.02 to 0.1 is reasonable for x. Resonant impact ionization can take place also in InAs (Indium-Arsenide) and $Cd_{0.73}Hg_{0.27}Te$ (Cadmium-Mercury-Tellurium) etc..

Figure 3:
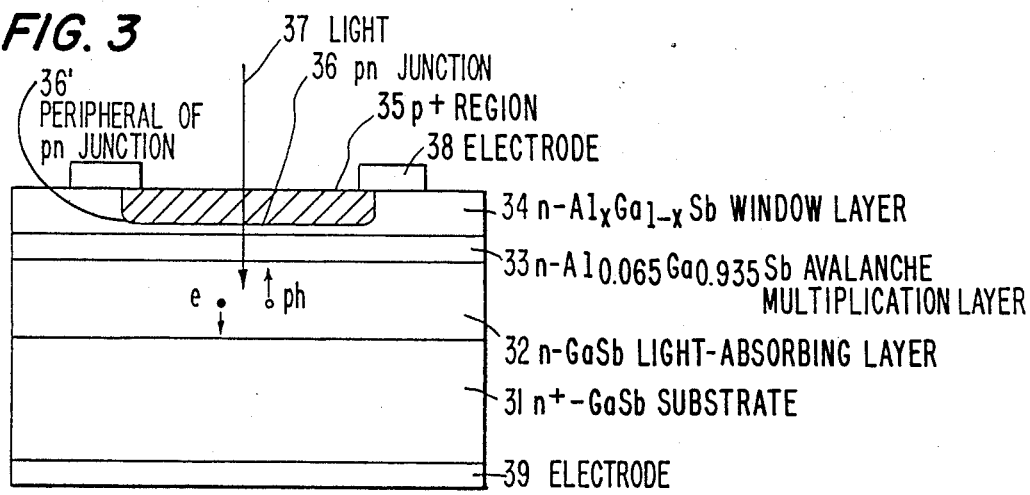
FIG. 3 is a cross-sectional side view of an APD according to the present invention.

A preferred embodiment of the present invention is hereinafter described in detail in FIG. 3 which is a cross-sectional side view. The numeral 31 denotes a substrate made of n+-type GaSb having an impurity concentration, for example, of between approximately $10^{17}$ and $10^{18}$ cm$^{-3}$. On the substrate 31, a light-absorbing layer 32, approximately 2 to 4 $\mu$m thick, made of n-type GaSb having an impurity concentration of, for example, of approximately $1 \times 10^{15}$ cm$^{-3}$ and having a band gap which meets the wave length of the injected light 37 to be detected, is formed by a widely known technology, such as LPE (liquid phase epitaxy). On the light-absorbing layer 32, an avalanche multiplication layer 33 composed of n-type $Al_{0.065}Ga_{0.935}Sb$, approximately 0.5 to 4 $\mu$m thick, and having an impurity concentration of, for example approximately $1 \times 10^{15}$ cm$^{-3}$, is formed by a widely known technique, such as LPE. The band gap energy of the light absorbing layer 32 is preferably lower than that of the avalanche multiplication layer 33. On the avalanche multiplication layer 33, a window layer 34, approximately 2 $\mu$m thick, made of n-type $Al_xGa_{1-x}Sb$ where x is, for example 0.28, having an impurity concentration of, for example, approximately $1 \times 10^{16}$ cm$^{-3}$ and having a larger and gap energy than the avalanche multiplication layer 33, is formed by a widely known technique, such as LPE. The value x of the window layer 34 is chosen more than, for example 0.2, so as to have a larger band gap energy than that of the avalanche multiplication layer 33. At a central surface of the window layer 34, a p+-type region 35 having an impurity concentration of, for example, approximately $1 \times 10^{18}$ cm$^{-3}$ at the surface, is formed and is approximately 1 to 1.5 $\mu$m deep. The p+-type region 35 is formed by diffusion of Zn (Zinc) or by ion implantation of Be (Beryllium) into the window layer 34 so that a pn junction 36 is formed with the window layer 34 and the p+-type region 35. Fabrication of a p-type region on an n-type layer is easy. An electrode 38 for supplying an operating reverse voltage to the APD is formed in, for example, a ring shape on the surface edge of the p+-type region 35 with, for example, Au/Zn/Au (Gold/Zinc/Gold). As a return terminal of the supplied voltage, an electrode 39 is formed on the bottom surface of the substrate 31 with, for example, AuGe/Au (Gold-Germanium/Gold).

The light 37 to be detected is injected through the p+-type region 35, the window layer 34 and the avalanche multiplication layer 33, all of which are transparent to the injection light 37 because of the wider band gap energy thereof, into the light-absorbing layer 32. Electrons "e" and positive holes "ph" are produced in the light-absorbing layer 32 by the excitation of the injected light 37. The produced positive holes "ph" in the light-absorbing layer 32 are accelerated by the voltage applied to the avalanche multiplication layer 33 and window layer 34, both of which are semiconductor materials capable of causing avalanche breakdown.

Figure 6:
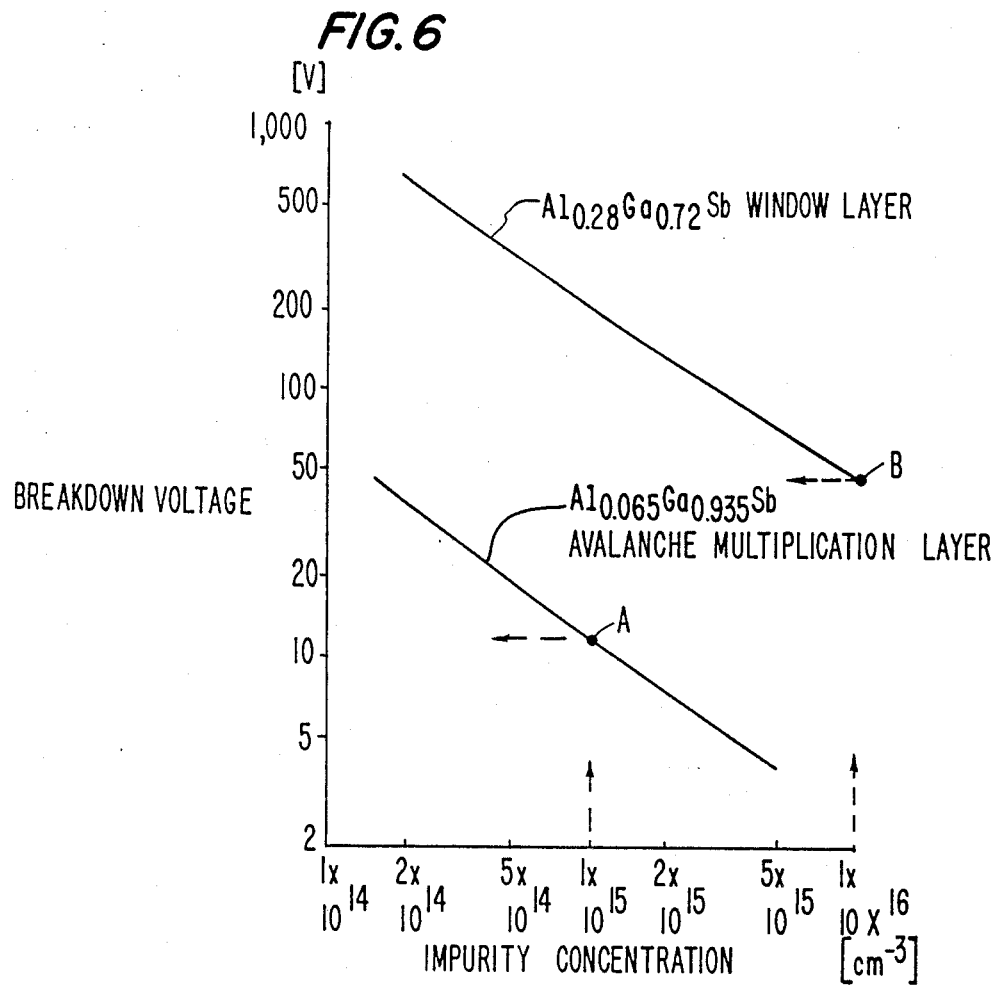
FIG. 6 is a graph of the avalanche break down voltage versus the carrier density in avalanche multiplication materials.

Avalanche breakdown voltages of n-type $Al_{0.28}Ga_{0.72}Sb$ material used for the window layer 34 and the n-type $Al_{0.065}Ga_{0.935}Sb$ material used for the multiplication layer 33, depending on the impurity concentration therein are shown in FIG. 6. As observed in FIG. 6, the pn junction formed in the window layer having a bigger band gap energy, such as the n-type $Al_{0.28}Ga_{0.72}Sb$, can increase the avalanche breakdown voltage higher than that formed in the avalanche multiplication layer having smaller band gap energy by resonant impact ionization, such as the n-type $Al_{0.065}Ga_{0.935}Sb$, thus resulting in decreased tunnel current. In addition, both the resonant impact ionization taking place at a low voltage and the above-mentioned band gap energy difference contribute to prevent unexpected local avalanche breakdown.

Figure 5:
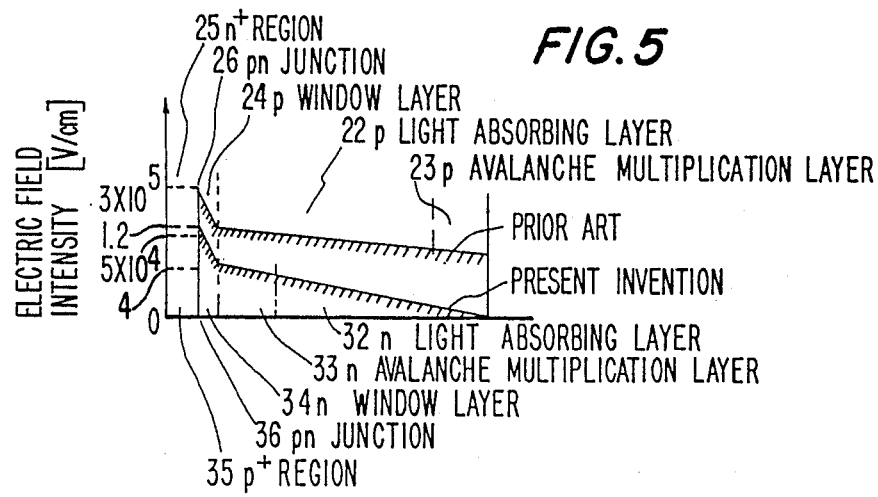
FIG. 5 is a graph of the distributions of the electric field in the APD of the present invention and the APD in prior art FIG. 2.
Figure 7:
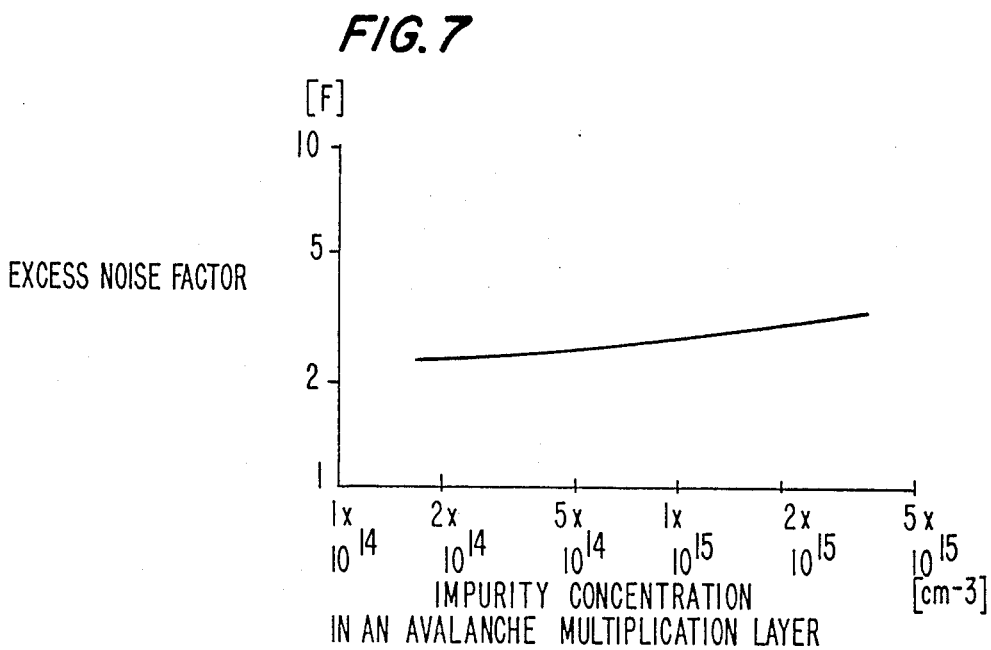
FIG. 7 is a graph of the excessive noise factor versus the carrier density in the avalanche multiplication layer.

In the present invention, where the avalanche multiplication layer 33 has an impurity concentration of $1 \times 10^{15}$ cm$^{-3}$ and the window layer 34 has an impurity concentration of $1 \times 10^{16}$ cm$^{-3}$, as indicated respectively by the marks A anb B in FIG. 7, the avalanche breakdown voltage of the avalanche multiplication layer 33 is approximately 12 V shown by the mark A, which is much less than approximately 50 V shown by the mark B, of the avalanche breakdown voltage of the window layer 34. In FIG. 5, distributions the electric field intensity in the APD of the present invention are compared with the prior art APD. Because the avalanche multiplication layer 33 is located between the window layer 34 and the light absorbing layer 32, the electric field intensity applied to the light absorbing layer 32, having a small band gap energy, becomes small. Thus, the dark current is reduced. Further, in FIG. 5, it is observed that the critical electric field intensity for the avalanche breakdown by the resonant impact ionization, i.e., $4 \times 10^4$ V/cm, is achieved at the avalanche multiplication layer 33, while the electric field intensity at the pn junction 36 in the window layer 34 is $1.2 \times 10^5$ V/cm, which is lower than its avalanche breakdown condition. Thus, because this applied voltage of 12.5 V has an ample margin for the avalanche breakdwon of the window layer 34, the avalanche breakdown in the avalanche multiplication layer 33 is not affected by the undesirable local electric field at the pn junction, caused by an irregularity, such as a lattice defect or a sharp peripheral, in the window layer 34. Therefore, in the avalanche multiplication layer, avalanche multiplication can be always initiated uniformly and is, not affected by the electric field at the pn junction where the electric field is maximum. The multiplied amount of positive holes become conductive carriers passing through the window layer 34 and the pn junction 36. The multiplication factor M easily reaches a value between 10 to 20 which is generally adopted and satisfactory in optical communication system. A valve between 10 to 20 of the ionization rate ratio $\beta/\alpha$ is easily achieved as well, resulting in considerable reduction in the excessive noise factor thereof and an increase in the operation speed.

Figure 1:
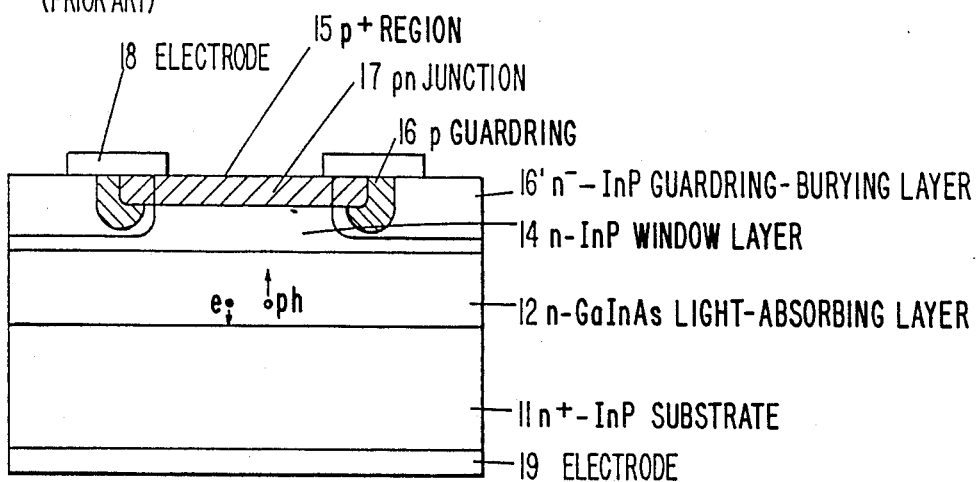
FIG. 1 is a cross-sectional side view of a prior art APD.
Figure 2:
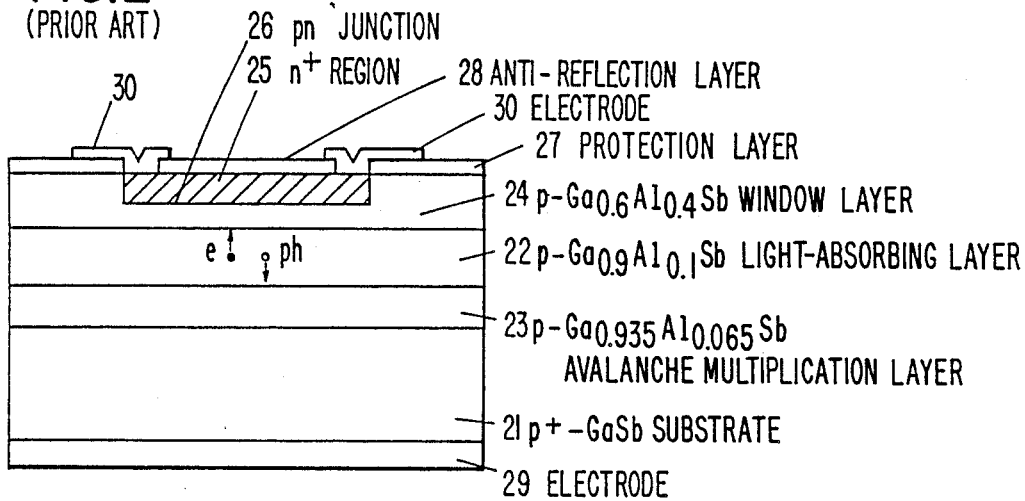
FIG. 2 is a cross-sectional side view of a structure of a piror art APD which employs resonant impact ionization.

In FIG. 7 is a graph of the excessive noise factor F to the amount of the impurity concentration, when the n-type GaSb light-absorbing layer 32 receives light having a 1.55 $\mu$m wave length. The produced positive holes therein are injected into the $Al_{0.065}Ga_{0.935}Sb$ avalanche multiplication layer 33 and cause an avalanche multiplication whose multiplication factor is 10. As seen in FIG. 7 the excessive noise factor F, though varying with the value of the impurity concentration, shows approximately F<3. This value 3 is consideralby lower than the value 5 achieved by the prior art APD using InP/GaInAs shown in FIG. 1. As for the operation speed, owing to the increase in the amount of the ionization ratio, the high frequency response, namely the cut off frequency, is increased from approximately 3 GHZ of the prior art APD of FIG. 1, to approximately 10 GHZ of the present invention. Furthermore, reduction of the field intensity at the pn junction where the field intensity becomes maximum, the large band gap energy of the window layer and reduction of the field intensity in the light absorbing layer contribute to achieve further reduction of the dark current. It is another advantage of the invention that the applied operating voltage is consideraly reduced from approximately 100 V of the first prior art APD of FIG. 1, or from approximately 20 V of the second prior art of FIG. 2 down to approximately 12.5 V.

As for the fabrication of the APD in the process is simple and no difficulties have been found to exist.

Although the anti-reflection layer and the protection layer are not referred to in the above-described preferred embodiment, it is apparent that they can be provided on the APD of the present invention.

Although only one type of material for resonant impact ionization is referred to in the above-described preferred embodiment, it is apparent that other types of materials which can cause resonant impact ionization are applicable to the APD of the present invention.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What we claim is:

1. A semiconductor photodiode, comprising:
   a semiconductor substrate having a first conductivity type;
   a light-absorbing layer formed on said semiconductor substrate of said first conductivity type semiconductor, said light absorbing layer receiving light so as to produce carriers responding to the intensity of said received light;
   an avalanche multiplication layer formed on said light absorbing layer composed of a semiconductor material which causes carrier multiplication therein by a resonant impact ionization, formed of said first conductivity type semiconductor, said avalanche multiplication layer having a first band gap energy;
   a window layer formed on said avalanche multiplication layer of said first conductivity type semiconductor, said window layer having a second band gap energy which is greater than said first band gap energy;

an impurity region formed of a second conductivity type semiconductor opposite said first conductivity type, doped in said window layer, for forming a p-n junction in said window layer, said p-n junction being located entirely within said window layer;

a first electrode formed on said window layer and contacting said impurity region; and a second electrode contacting said semiconductor substrate.

2. A photo-diode according to claim 1, wherein said light-absorbing layer has a third band gap energy which is less than said first band gap energy.

3. A photo-diode according to claim 1, wherein said semiconductor material of said avalanche multiplication layer comprises $Al_xGa_{1-x}Sb$, where the aluminum content x if from 0.02 to 0.1.

4. A photo-diode according to claim 1, wherein said semiconductor material of said avalanche multiplication layer is one selected from a group of InAs and $Cd_xHg_{1-x}Te$, where the cadmium content x is approximately 0.73.

5. A photo-diode according to claim 3, wherein said semiconductor material of said window layer comprises $Al_xGa_{1-x}Sb$, where the aluminum content x is more than 0.2.

6. A photo-diode according to claim 3, wherein said semiconductor material of said light-absorbing layer comprises GaSb.

7. A semiconductor photo-diode, comprising:
a semiconductor substrate formed of n-type GaSb;
a light-absorbing layer formed on said substrate of n-type GaSb having a lower impurity concentration than said n-type GaSb of said substrate;
an avalanche multiplication layer formed on said light-absorbing layer of an n-type $Al_xGa_{1-x}Sb$ semiconductor, where the aluminum content X is from 0.02 to 0.1;
a window layer formed on said avalanche multiplication layer of an n-type semiconductor having a band gap energy which is larger than a band gap energy of said avalanche multiplication layer; and
a p-type region doped in said window layer, for forming a pn junction in said window layer, said p-n junction being located entirely in said window layer.

* * * * *